United States Patent [19]
Ma et al.

[11] Patent Number: 5,414,693
[45] Date of Patent: May 9, 1995

[54] SELF-ALIGNED DUAL-BIT SPLIT GATE (DSG) FLASH EEPROM CELL

[75] Inventors: Yueh Y. Ma, Los Altos; Kuo-Tung Chang, San Jose, both of Calif.

[73] Assignee: Hyundai Electronics Industries Co., Ltd., Seoul, Rep. of Korea

[21] Appl. No.: 269,972

[22] Filed: Jul. 1, 1994

Related U.S. Application Data

[62] Division of Ser. No. 134,779, Oct. 12, 1993, Pat. No. 5,364,806, which is a division of Ser. No. 751,499, Aug. 29, 1991, Pat. No. 5,278,439.

[51] Int. Cl.⁶ ............................................. E11C 11/40
[52] U.S. Cl. ................... 365/185; 365/900; 257/315; 257/316
[58] Field of Search ................. 365/900, 185; 257/315, 257/316, 319

[56] References Cited

U.S. PATENT DOCUMENTS

| | | | |
|---|---|---|---|
| 4,639,893 | 1/1987 | Eitan | 365/185 |
| 4,868,629 | 9/1989 | Eitan | 365/185 |

FOREIGN PATENT DOCUMENTS

| | | | |
|---|---|---|---|
| 2309681 | 12/1990 | Japan | 365/185 |

*Primary Examiner*—Viet Q. Nguyen
*Assistant Examiner*—Tan Nguyen
*Attorney, Agent, or Firm*—Townsend and Townsend Khourie and Crew

[57] ABSTRACT

An EEPROM cell structure includes two floating gate transistors separated by a select gate transistor with the select transistor being shared by the two floating gate transistors in programming, reading, and erasing a floating gate transistor. The floating gates of the two transistors are formed from a first polysilicon layer, the control gates of the two transistors are formed from a second polysilicon layer, and the select gate is formed from a third doped polysilicon layer. The channel length of the select gate transistor is fully self-aligned to the floating gate transistors. A word line is formed over the control gates and forms the select gate. The word line runs generally perpendicular to bit lines which contact the drain regions of the two floating gate transistors. Accordingly, a virtual ground flash EEPROM memory array can be fabricated using the EEPROM cell structure.

3 Claims, 6 Drawing Sheets

SELF-ALIGNED DUAL-BIT SPLIT GATE (DSG) FLASH EEPROM CELL

This is a Division of application Ser. No. 08/134,779, filed Oct. 12, 1993, now U.S. Pat. No. 5,364,806 which was a Division of application Ser. No. 07/751,499, filed Aug. 29, 1991, now U.S. Pat. No. 5,278,439.

BACKGROUND OF THE INVENTION

This invention is related to our co-pending application Ser. No. 07/585,811 filed September 20, 1990 for "Triple Polysilicon Flash Eprom Device".

This invention relates generally to semiconductor memory devices, and more particularly the invention relates to a triple polysilicon self-aligned split gate flash EEPROM cell.

A 5 volt only triple-poly flash EEPROM cell with a split gate structure is disclosed in Naruke, et al., "A New Flash-Erase EEPROM Cell With a Sidewall Select-Gate On Its Source Side", Technical Digest of IEEE Electron Device Meeting 1988. As disclosed therein, a double polysilicon floating gate transistor is formed by first and second layers of polysilicon using conventional processing, and a select gate transistor is then formed by using an etching-back technology after depositing a third layer of polysilicon. The length of the select gate transistor is defined by the height of the double polysilicon floating gate transistor which is about 0.4 um. Due to the etching-back technology, the select gate transistor must run parallel to the control gate.

FIG. 1 illustrates the disclosed flash EEPROM cell. The flash EEPROM cell comprises N+ source region 11a and N+/N− drain region 11b separated by channel region 12. Channel region 12 consists of a portion 12a beneath the floating gate 13 and a portion 12b beneath the select gate 14. Overlying channel region 12 is gate dielectric 16a on which is formed the floating gate 13 and the select gate 14. Overlying floating gate 13 is insulation 16b, typically a composition layer of thermally grown oxide, deposited silicon nitride, and thermally grown oxide and nitride. A control gate 17 is formed on top of the insulation 16b. Typically both the floating gate 13 and the control gate 17 are formed of polysilicon. An insulation 16c is formed on the sidewall of the floating gate 13 and the control gate 17. The select gate 14 is formed by depositing the third layer of polysilicon and then by etching back the polysilicon to form a polysilicon spacer. The programming (high threshold voltage) of the cell is accomplished by raising the control gate to about 17 volts, the select gate to slightly above the threshold voltage of the select gate transistor which is about 1.5 volts, the drain to 5 volts, and the source to ground. The channel electrons are accelerated through a potential drop in between the select gate and the floating gate transistors. It is known that the hot electron injection efficiency using this method can be a thousand times higher than the conventional lateral acceleration method. Due to the high programming efficiency, the flash cell can be programmed with a lower drain voltage (5 volts) and with very low programming current (few micro-amperes). Erase of the cell is achieved by raising the drain region 1ib to 14 volts, grounding the control gate, and opening the source (floating). The high erase voltage can be obtained by using a charge pump technique from a 5 volt power supply. These features allow operation with a single 5 volt power supply.

Several major drawbacks in the prior art flash EEPROM of FIG. 1 relates to the formation of the select gate transistor. First, the split gate cell as disclosed in the prior art consists of two transistors which are the floating gate and the select gate. It takes the space of two transistors to form a single memory bit when it is implemented in a memory array. This is a common drawback for conventional split gate structure and imposes a major limitation for implementing a high density memory array. Second., the select gate is a polysilicon spacer which is formed by the polysilicon etching-back technique, and the length of the select gate is determined by the combined[height of the floating gate and the control gate which is about 0.4 um. Punchthrough of this transistor is very difficult to prevent with this small channel length, especially when the floating gate is over erased to a negative threshold. Third, the select gate is formed of polysilicon and it is very difficult to apply deposited polycide on a polysilicon spacer. Thus, in the prior art, only polysilicon with resistance around 20 to 30 ohm per square can be used for the select gate. As a result, the word line RC delay of a memory circuit is considerably longer than in the conventional memory circuit in which the polycide with resistance in the range of 2 to 4 ohm per square is used. Fourth, due to the etching-back method in the prior art, the select gate can only run parallel to the control gate. However, in a high density virtual ground array the select gate must be perpendicular to the control gate. Thus, the flash EEPROM cell in the prior art FIG. 1 cannot be implemented in a higher density virtual ground array structure.

As disclosed in our co-pending application Ser. No. 07/585,811 filed September 20, 1990 for "Triple Polysilicon Flash EPROM Device", a conventional virtual ground memory array as shown in FIG. 1B is formed by using the flash EPROM cell as disclosed in the above application. The channel length of the select gate transistor is non-self-aligned and is defined by using a photoresist as a bit line mask as shown in FIG. 1C. Due to the mis-alignment between the bit line mask and the stacked floating and control gates, the non-self-aligned select gate channel length is determined by the photoresist to floating gate edge dimensiona 19B and the mis-alignment tolerance (MA). Typically, the mis-alignment tolerance is in the range of 0.3 to 0.5 um which will be a major limitation for high density memory array. As shown in FIG. 1B, since each memory bit needs one bit line diffusion 18, one floating gate length 19A, and one non-self-align select gate length 19B+MA, the total dimension per memory bit is equal to 18+19A+19B + MA. It can be seen that in the conventional split gate virtual ground array as shown in FIG. 1B, each floating gate transistor needs one select gate transistor in which the select gate transistor is non-self-aligned to the floating gate edge. This indicates that the convention split gate virtual ground may have its limitation for implementing an ultra high density memory array.

SUMMARY OF THE INVENTION

An object of the invention is a dual-bit split gate flash EEPROM cell structure using one select gate transistor and two floating gate transistors to form two memory bits in one cell.

Another object of the invention is a method of making a fully self-aligned split gate flash EEPROM cell structure by using self-aligned etching step to accurately define the channel length of the select gate transistor.

Still another object of the invention is a high density dual-bit flash EEPROM array using the dual-bit split gate flash EEPROM cell.

A feature of the invention is that in the dual-bit split gate flash EEPROM cell, a single select gate transistor is shared by two adjacent floating gate transistors, i.e., a single select gate transistor is used for two memory bits.

Another feature of the invention is that dual-bit split gate flash EEPROM cell, the select gate transistor in the split gate structure is fully self-aligned.

Still another feature is that in the dual-bit flash EEPROM array, two floating gate transistors are put in-between two bit lines.

Still another feature of the invention is that in the dual-bit flash EEPROM cell, the access of one of the two floating gate transistors is through the turn-on of the select gate transistor and the other floating gate transistor.

Another feature of the invention is that the select transistor in the split gate structure is fully self-aligned.

The present invention relates to a high density flash EEPROM cell which is made by a triple-polysilicon process with a split gate structure and four terminals (control gate, select gate, drain and source) wherein one select gate transistor is shared by two floating gate transistors. Unlike the split gate structure disclosed in the prior art and the conventional split gate virtual ground array as disclosed in the co-pending application in which each floating gate transistor needs one select gate transistor the dual-bit split gate cell needs only half of the select gate transistor for each floating gate transistor. Moreover, unlike the conventional split gate cell in which the channel length of the select gate transistor is non-self-aligned to the edge of the floating gate transistor, the channel length of the select gate transistor in the dual-bit split gate cell is accurately defined and is fully self-aligned by the separation of two floating gate transistors which is formed by self-aligned polysilicon etching step.

In a preferred embodiment a high density 5 volt virtual ground flash EEPROM cell is fabricated using the triple polysilicon process with a split gate structure and the four terminals (control gate, select gate, drain and source) for each cell. One select transistor is shared by two floating gate transistor cells. The channel length of the select transistor is fully aligned with the floating gate transistors and is defined in a self-alignment etching process in forming the control gate and floating gate for each of the two floating gate transistors.

Advantageously, the select gate runs perpendicular to the bit lines as required in a virtual ground flash EEPROM. The select gate can have a polycide layer formed thereon to reduce resistance and RC delay of a word line.

The invention and objects and features thereof will be more readily apparent from the following detailed description and appended claims when taken with the drawings.

The invention and objects and features thereof will be more readily apparent from the following detailed description and appended claims when taken with the drawings.

DETAILED DESCRIPTION OF THE ILLUSTRATIVE EMBODIMENTS

Figure 1A:
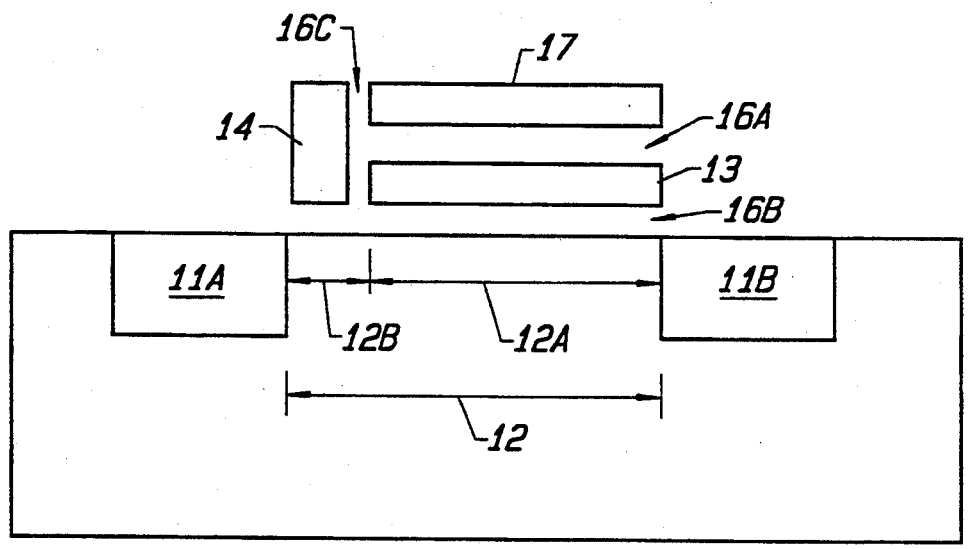
FIG. 1A is a section view of a triple polysilicon EEPROM cell in accordance with the prior art.
Figure 1B:
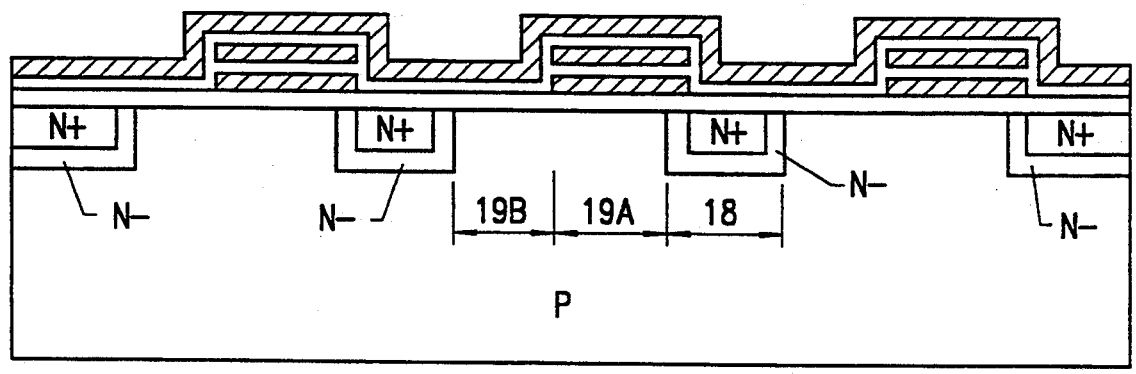
FIGS. 1B and 1C are section views of a triple polysilicon flash EPROM device in accordance with our co-pending application
Figure 1C:
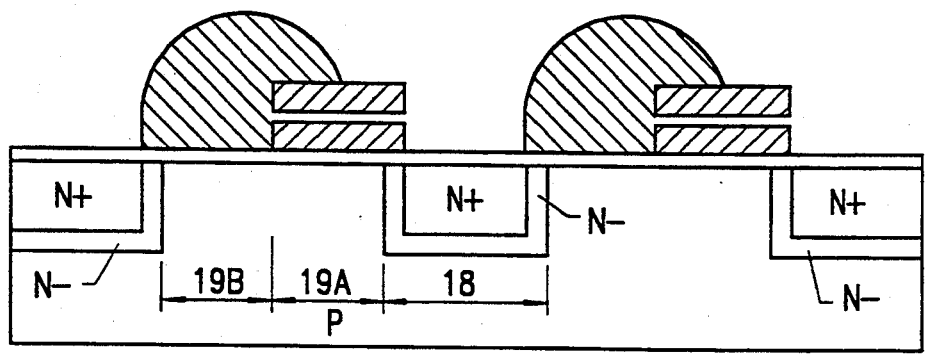
Figure 2A:
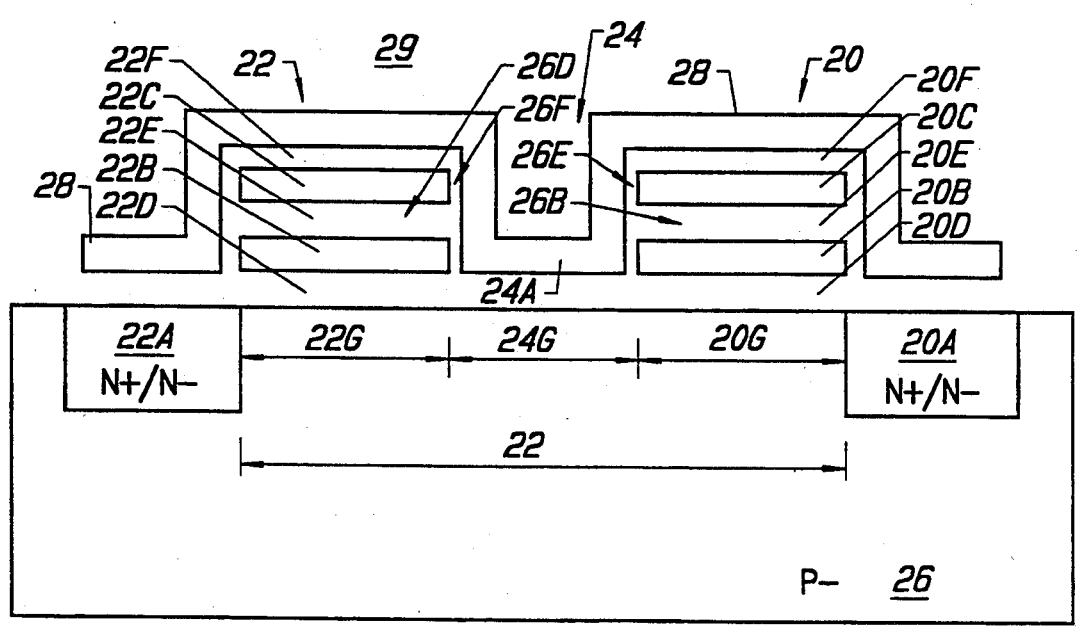
FIG. 2A, 2B, and 2C are a section view, plan view, and electrical schematic of a triple polysilicon EEPROM cell in accordance with one embodiment of the present invention.
Figure 2B:
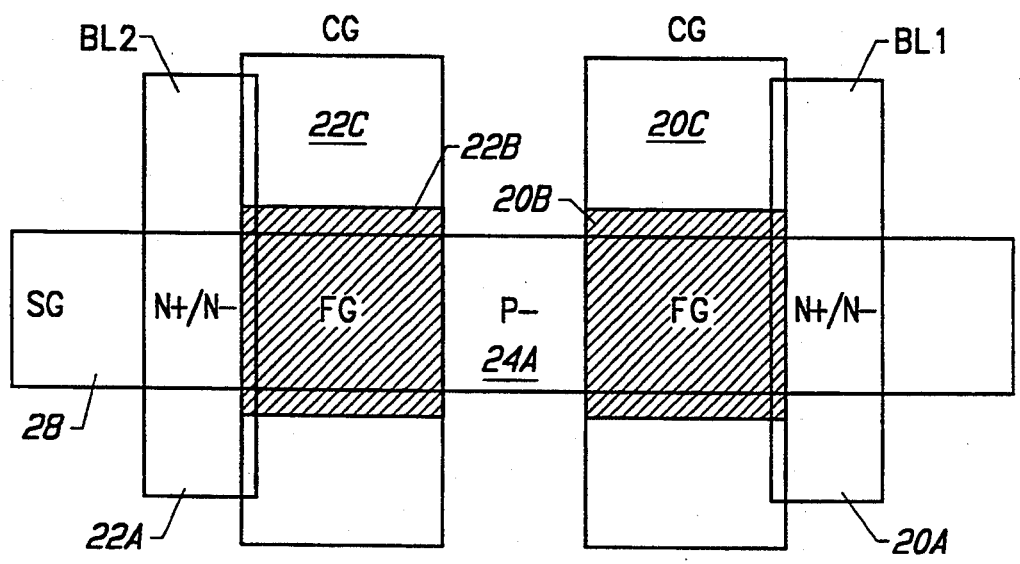
Figure 2C:
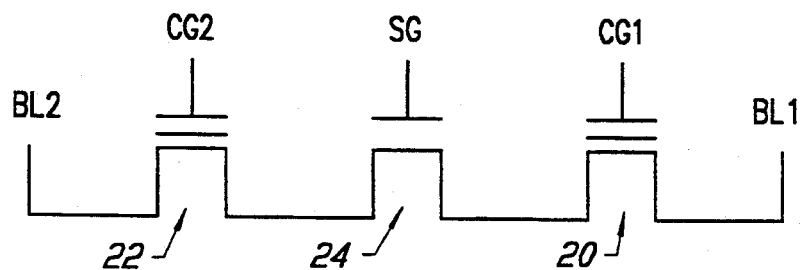

Referring now to the drawings, FIGS. 2A, 2B, and 2C are a section view, top plan view, and schematic of a dual-bit flash EEPROM cell in accordance with one embodiment of the invention. The cell structure comprises a first floating gate storage transistor 20, a second floating gate storage transistor 22, and a select gate transistor 24 which serially connects transistors 20, 22. As illustrated schematically in FIG. 2C, a first bit line BL1 is connected to the drain of transistor 20, a second bit line BL2 is connected the drain of transistor 22, and the sources of the two transistors are serially connected through the select gate 24. As will be described further herein below, when reading storage transistor 20, transistors 22 and 24 are turned on and the drain of transistor 22 in effect becomes the source of transistor 20. Conversely, when reading transistor 22, transistors 20 and 24 are turned on and the drain of transistor 20 effectively becomes the source of transistor 22.

Figure 3:
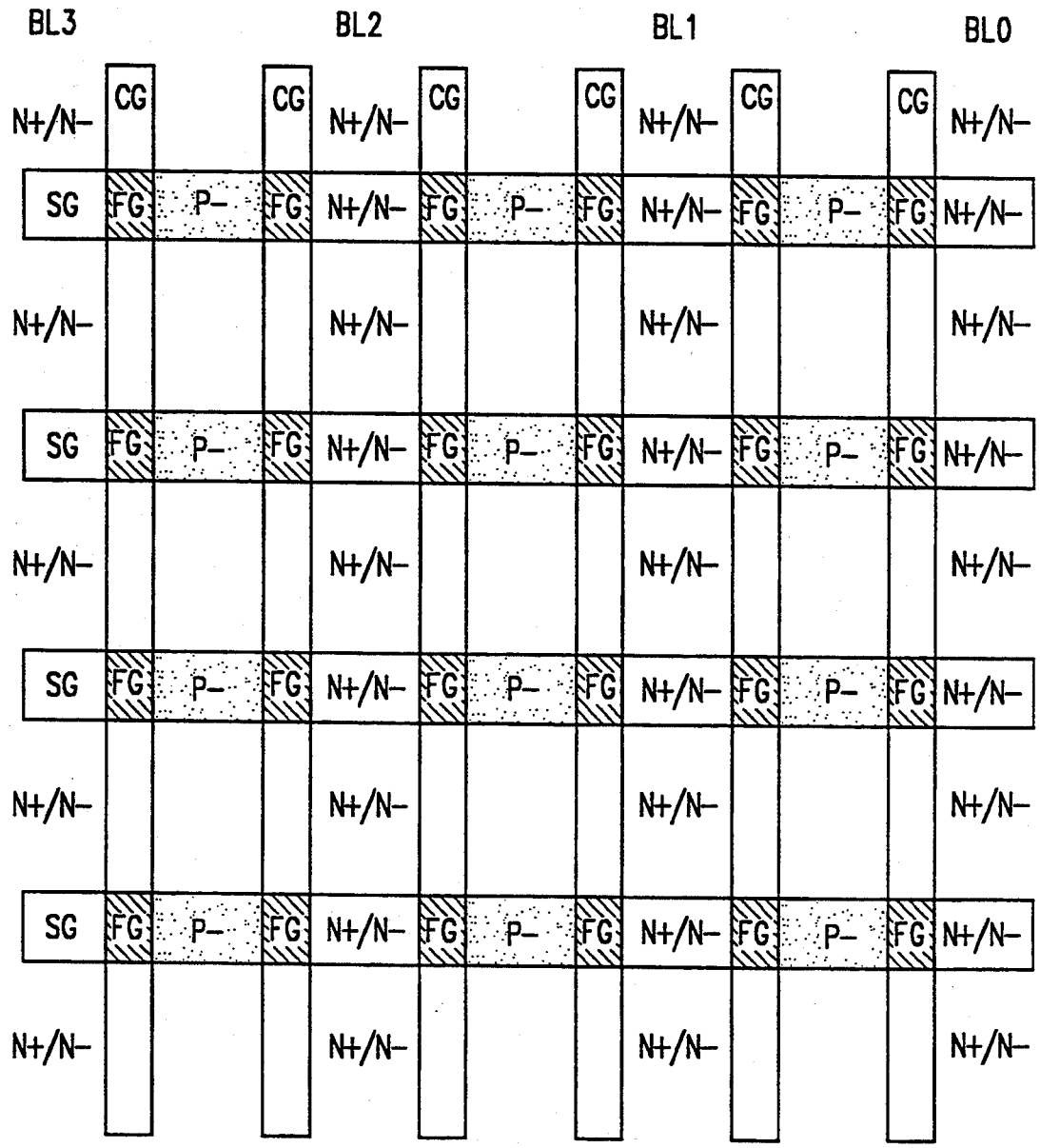
FIG. 3 is plan view of a portion of a memory array using the EEPROM cells of FIGS. 2A–2C.

Referring to the section view of FIG. 2A, the cell structure is formed in a P- doped substrate 26 with the drain 20a of transistor 20 and the drain 22a of transistor 22 comprising N+/N− doped regions in the surface of the substrate 26. The drains are interconnected with drains in common rows of transistors and form the cell bit lines. Transistor 20 includes a floating gate 20b and an overlying control gate 20c with the floating gate 20b separated from the surface of substrate 26 by a thin (e.g. 100 angstrom) gate oxide 20d, and the control gate 20c separated from the floating gate 20b by a dielectric 20e which can comprise silicon oxide, silicon nitride, or combination thereof. Similarly, transistor 22 includes a floating gate 22b, a control gate 22c, with dielectrics 22d and 22e electrically isolating the floating gate and control gate from each other and from the substrate. Dielectric 20f and 22f form part of a dielectric layer overlying the control gates and the surface of substrate 26. A word line 28 extends over the dielectric layer and forms the control gate 24a of the select transistor intermediate the floating gate transistors 20, 22. The word line 28 serially connects the gates of the select transistors in one row of a memory array and runs perpendicular to the bit lines connected to the drains of transistors in columns such as drains 20a and 22a as illustrated in the plan view of a portion of a flash EEPROM array shown in FIG. 3.

FIG. 2A shows the section view of the present invention in which a dual-bit split gate flash EEPROM cell contains two memory bits. Unlike the split gate structure disclosed in the prior art and the conventional split gate virtual ground array as disclosed in the co-pending application in which each floating gate transistor needs one select gate transistor the dual-bit split gate cell needs only half of the select gate transistor for each floating gate transistor. Moreover, unlike the conventional split gate cell in which the channel length of the select gate transistor is non-self-aligned to the edge of the floating gate transistor, the channel length of the select gate transistor in the dual-bit split gate cell is accurately defined and is fully self-aligned by the separation of two floating gate transistors which is formed by self-aligned polysilicon etching step. As shown in FIG. 2A, each memory bit consists of one half of diffusion 20A one floating gate length 20G, and one half of the select gate length 24G such that the total dimension of one memory bit is equal to half of 20A+20G+half of 24G. The half select gate for each memory bit and the fully self-alignment of the select gate channel length features make the dual-bit split gate most scaleable for ultra high density memory array in the application such as solid-state-disk-drive and IC memory card. In addition, when compared to the prior art, the select gate can be implemented by using polycide to reduce the work line RC delay.

Figure 4A:
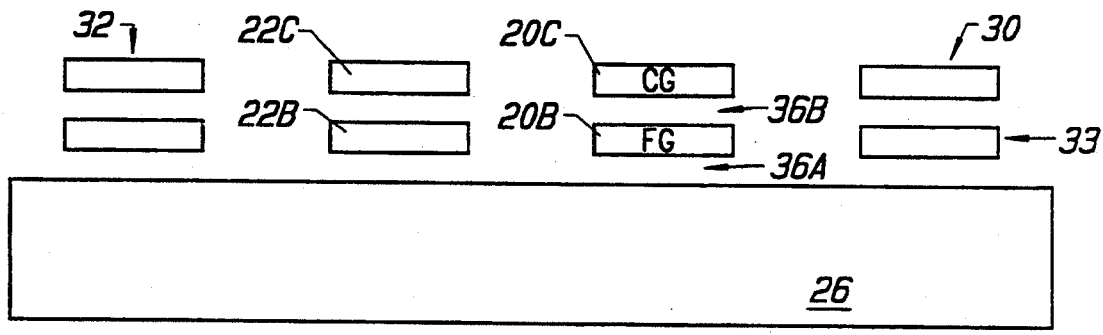
FIGS. 4A–4C are section view illustrating steps in fabricating the cell structure of FIGS. 2A–2C.
Figure 4B:
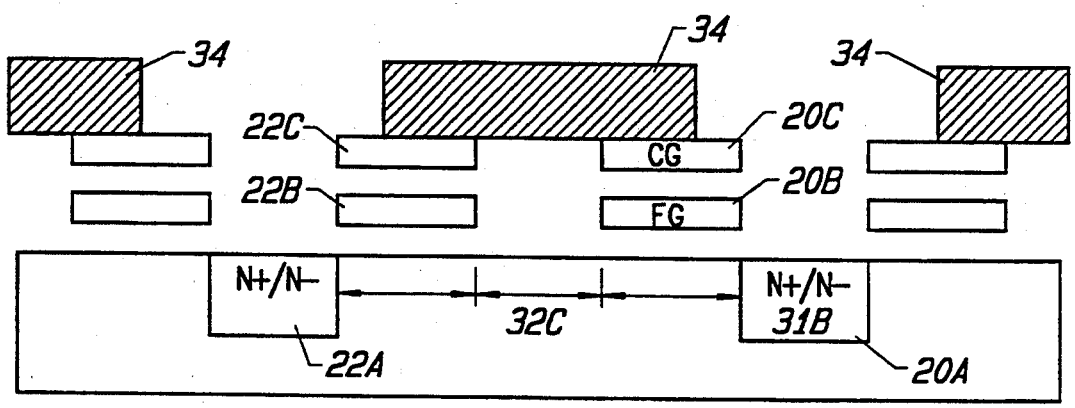
Figure 4C:
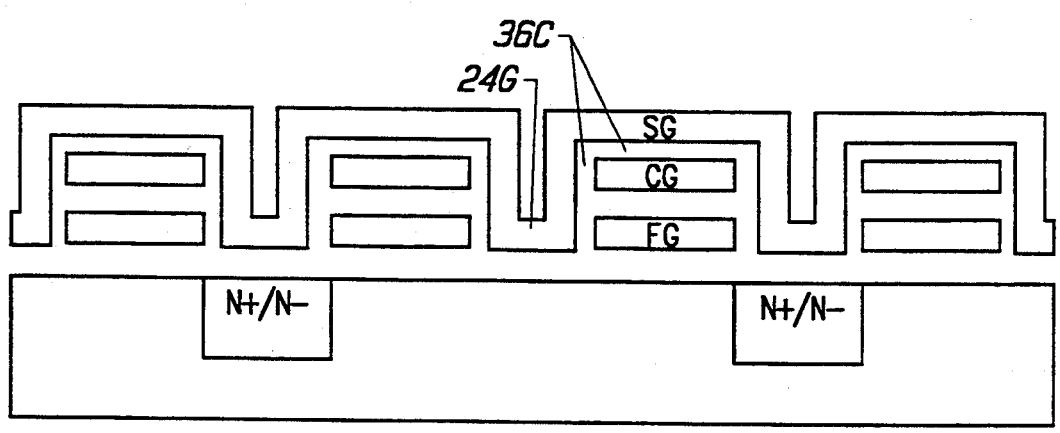

Fabrication of the cell structure of FIGS. 2A–2C is illustrated in the section views of FIGS. 4A–4C. Like elements have the same reference numeral. First a thin gate oxide of approximately 100 angstroms is thermally grown on the surface of P- doped semiconductor substrate 26 having a resistivity of 10–25 ohm centimeter. A first layer of doped polysilicon is then deposited on top of the thin oxide and is patterned in one direction to partially form the floating gate layer. An insulation layer of silicon oxide, silicon nitride, or combination thereof is then formed on top of the floating gate layer, and a second doped polysilicon layer is then deposited and patterned in one direction for the control gates. In so doing, the double polysilicon stack is etched to form the control gates 20c, 22c and the floating gates 20b, 22b which are self-aligned, as indicated, with insulation therebetween. Similar structures are formed for adjacent transistors are illustrated at 30 and 32.

Next, as illustrated in FIG. 4B a photoresist layer 34 is formed and patterned to partially cover one portion of the double polysilicon stack, and an ion implantation step forms the bit line regions 20a and 22a. By implanting two different n-type dopants such as arsenic and phosphorous and then annealing the structure, the N+/N− dopant profile results. This process is described in co-pending application Ser. No. 07/585,811, supra. The substrate region which is covered by the photoresist between the stacked control gate/floating gate structure does not receive the ion implantation and is used to define the channel length of the select gate transistor.

The photoresist is stripped, and a silicon oxide insulation layer is formed on the top and side walls of the double polysilicon stacks. A third layer of doped polysilicon is then deposited and patterned to form a word line and the select gate 24 as shown in FIG. 4C. The word line is perpendicular to the control gates and runs to adjacent select gates along the word line. The select gate is accurately defined by the separation of the two floating gate transistors which are formed by the self-aligned etching step. The channel length of the select transistor is about 0.6 to 0.8 micron and is fully aligned with the floating gate transistors. Note that the select transistor channel 24g is positioned between the channels 20g and 22g of the floating gate transistor 20 and 22, respectively, as shown in FIGS. 2A. A polycide coating can be applied on the select gate and word line to reduce the word line RC delay. Moreover, by running the select gate perpendicular to the control gate the flash EEPROM cell can be implemented in a high density virtual ground array.

Programming of the floating gate transistor 20 is achieved by raising the control gates 20c and 22c to 12 volts, the select gate 24a to slightly above the threshold voltage of the select gate transistor (approximately 2 volts) the bit line (drain) 20a to 5 volts, and the bit line (drain) 22a is grounded. The floating gate transistors are fully turned on due to the 12 volts on the control gates and the select gate transistor being slightly turned on. Under this condition channel current during programming is controlled by the select gate transistor and is in the range of 10–20 microamps. The channel electrons are accelerated at the potential drop between the select gate region 24g and the floating gate region 20a and are injected into the floating gate 20b through the barrier of the thin gate oxide 20d by hot electron injection.

A read operation of the floating gate transistor 20 is achieved by putting 12 volts on the control gate of transistor 22 to turn on the transistor 22, 5 volts on select gate 24 and control gate 20c, 1–2 volts on bit line 20a, and grounding bit line 22a. The back bias effect from floating gate transistor 22 is about 0.17 to 0.24 volt when its threshold voltage is −0.25 and 6.6 respectively.

The erase operation of the floating gate transistor 20 is achieved by raising the bit line 20a to 12 volts, grounding the control gates 20c and 22c, and opening the bit line 22a. Electrons are discharged from the floating gate 20b to the bit line 20a through Fowler-Nordheim tunneling effect.

The read, program, and erase operation conditions of the flash EEPROM cell are summarized in the following table:

| READ CELL 1 | PROGRAM CELL 1 | ERASE CELL 1 |
|---|---|---|
| $V_{sg}$ 5 | 1.8~2 | 0 |
| $V_{cg1}$ 5 | 12 | 0 |
| $V_{cg2}$ 12 | 12 | 0 |
| $V_{BL1}$ 1~2 | 5 | 12 |
| $V_{BL2}$ 0 | 0 | floating |

Note that the above table assumes that the cell is working with a 5 volt power source. A charge pump is required to generate the 12 volts necessary for programming, reading, and erasing the cell. However, if a 12 volt source is available the use of a charge pump is obviated, and the voltage on bit line 1 during programming can be increased to 6.5 volts to increase the speed of programming.

Figure 5A:
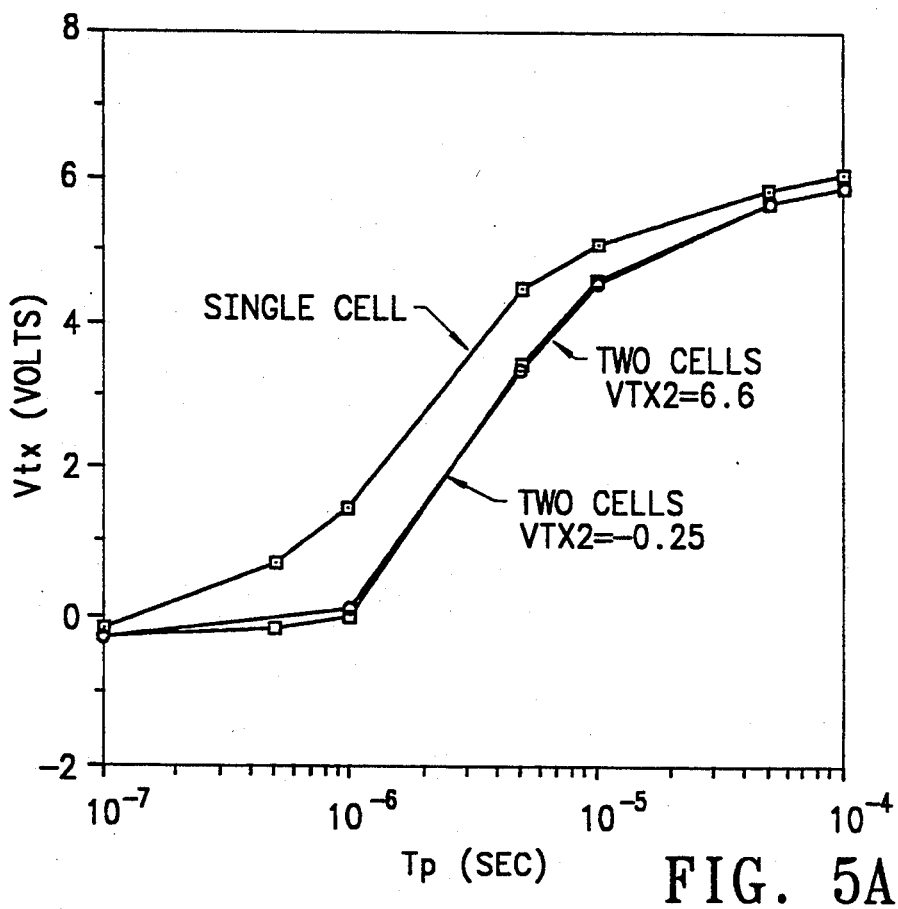
FIG. 5A is a plot of transistor threshold voltage versus programming time for the two cell structure of the invention.
Figure 5B:
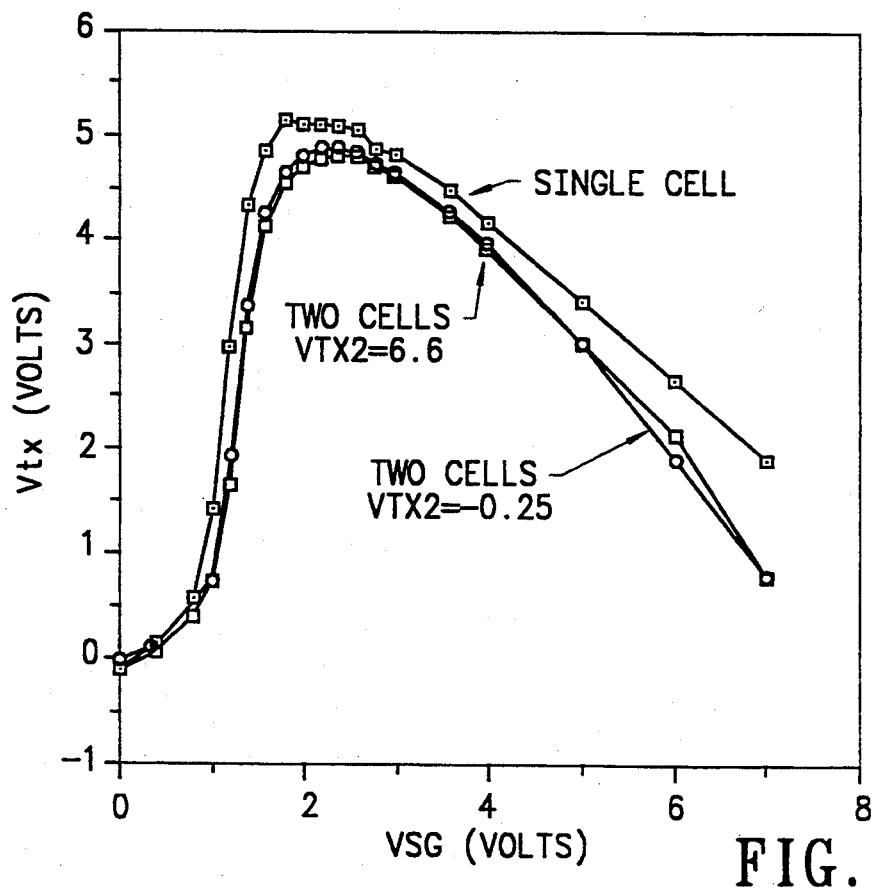
FIG. 5B is a plot of threshold voltage versus select gate voltage in programming the cell structure of the invention.

FIG. 5A is a plot illustrating threshold voltage change during programming versus programming time, and it will be noted that the threshold voltage of a transistor can be changed by more than 4.5 volts in less than 10 micro seconds. FIG. 5B is a plot illustrating the effect of select gate voltage, VSG on the programming of one floating gate transistor using 10 microsecond pulses. It can been seen that there is very little difference when the other floating gate transistor is at a high or low threshold voltage state.

Figure 6:
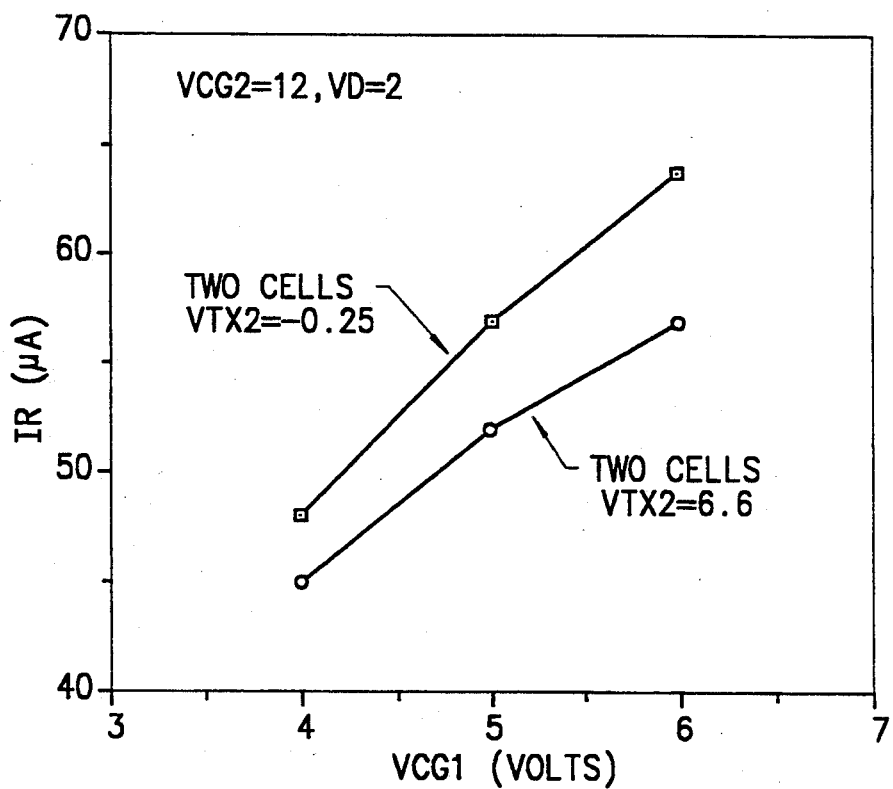
FIG. 6 is a plot of control gate voltage versus read current for the cell structure of the invention.

FIG. 6 is a plot of control gate voltage versus the read current when the floating gate transistors are at a high or low threshold voltage state.

Figure 7:
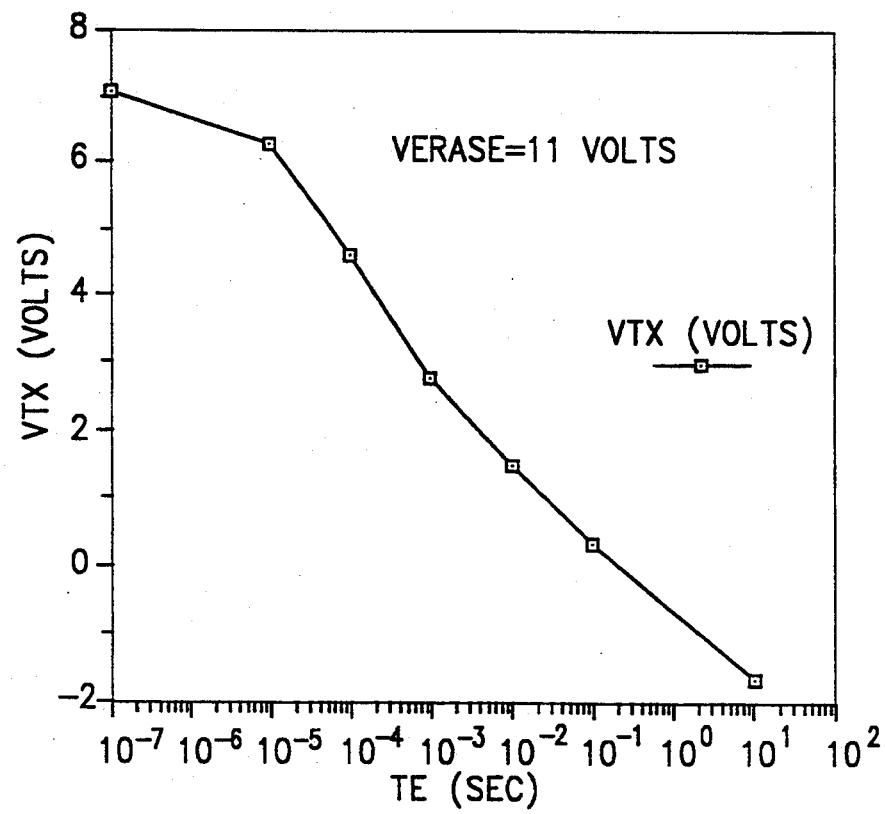
FIG. 7 is a plot of transistor threshold voltage versus erase time in erasing a cell of the structure of the invention.

FIG. 7 is a plot illustrating erase time versus threshold voltage for a transistor during an erase operation. The cell can be erased to zero threshold voltage in about 100 milliseconds.

There has been described a novel dual-bit flash EEPROM cell structure in which a pair of floating gate storage transistors share a single select gate transistor. The word lines interconnecting the select gates run perpendicular to the control gate lines and the bit lines interconnecting the drains of the floating gate transistors thus permitting a virtual ground flash array. Further, the word lines can have a silicide coating thus reducing the resistance and RC delay associated with the word lines. Unlike the spacer select gate of the prior art, the channel length of the select gate transistor is readily defined by the self-aligned etch of the floating gate transistors thus facilitating the optimization of the punch through characteristics of the select gate transistor. The fully self-aligned structure of the select transistor makes this cell the most scaleable in split gate structures.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A flash EEPROM array comprising
   a plurality of dual-bit flash EEPROM cell structures arranged in rows and columns, each cell structure including first and second floating gate transistors separated by a select gate transistor,
   a plurality of bit lines interconnecting drains of floating gate transistors of cell structures aligned vertically,
   a plurality of word lines interconnecting select gates of cell structures aligned horizontally,
   floating gates of said floating gate transistors being formed from a first polysilicon layer, the control gates of all floating gate transistors being formed from a second polysilicon layer, and said word lines and said select gates being formed from a third polysilicon layer.

2. The flash EEPROM array as defined by claim 1 wherein two bits are stored between adjacent bit lines.

3. The dual-bit flash EEPROM array as defined by claim 1 wherein programming, reading, and erasing a floating gate transistor in a cell structure is accomplished according to the following table:

| READ CELL 1 | PROGRAM CELL 1 | ERASE CELL 1 |
|---|---|---|
| $V_{sg}$ 5 | 1.8~2 | 0 |
| $V_{cg1}$ 5 | 12 | 0 |
| $V_{cg2}$ 12 | 12 | 0 |
| $V_{BL1}$ 1~2 | 5 | 12 |
| $V_{BL2}$ 0 | 0 | floating | where
   $V_{sg}$ is the voltage applied to said select gate,
   $V_{cg1}$ is the voltage applied to a first control gate,
   $V_{cg2}$ is the voltage applied to a second control gate,
   $V_{BL1}$ is the voltage applied to said first bit line,
   $V_{BL2}$ is the voltage applied to said second bit line.

* * * * *